United States Patent [19]
Nakatani et al.

[11] Patent Number: 5,150,413
[45] Date of Patent: Sep. 22, 1992

[54] EXTRACTION OF PHONEMIC INFORMATION

[75] Inventors: Tomofumi Nakatani, Yokohama; Shogo Nakamura, Matsudo, both of Japan

[73] Assignee: Ricoh Company, Ltd., Tokyo, Japan

[21] Appl. No.: 415,481

[22] Filed: Oct. 2, 1989

Related U.S. Application Data

[63] Continuation of Ser. No. 713,465, Mar. 19, 1985, abandoned.

[30] Foreign Application Priority Data

Mar. 23, 1984 [JP] Japan .................. 59-57161
Mar. 27, 1984 [JP] Japan .................. 59-59084

[51] Int. Cl.$^5$ ............................................ G10L 7/10
[52] U.S. Cl. .............................. 381/46; 381/41; 381/48; 364/724.16
[58] Field of Search .................. 381/36–50; 235/132; 364/724.16, 724.19, 724.2

[56] References Cited

U.S. PATENT DOCUMENTS

| | | | |
|---|---|---|---|
| 2,938,079 | 5/1960 | Flanagan | 381/50 |
| 3,639,691 | 2/1972 | Beringhof, Jr. | 381/42 |
| 3,786,188 | 1/1974 | Allen | 381/36 |
| 3,894,190 | 7/1975 | Gassmann | 381/36 |
| 3,928,755 | 12/1975 | Bellanger et al. | 235/152 |
| 4,038,495 | 7/1977 | White | 381/40 |
| 4,430,721 | 2/1984 | Acampora | 364/724.16 |
| 4,488,251 | 12/1984 | Wischermann | 364/724.16 |
| 4,524,423 | 6/1985 | Acampora | 364/724.16 |
| 4,674,125 | 6/1987 | Carlson et al. | 364/724.16 |
| 4,837,828 | 6/1989 | Watari | 381/36 |

OTHER PUBLICATIONS

Daniel L. Lapedes, McGraw-Hill Dictionary of Physics and Mathematics, 1978 by McGraw-Hill, Inc., p. 453.

*Primary Examiner*—Dale M. Shaw
*Assistant Examiner*—David D. Knepper
*Attorney, Agent, or Firm*—Cooper & Dunham

[57] ABSTRACT

When subjected to frequency analysis and plotted in a frequency spectral distribution, a voice signal typically includes a monotonously and relatively slowly changing component and a relatively rapidly changing component. For the recognition of voice sound, the relatively rapidly changing component contains phonemic information and thus is more important. In order to extract such a relatively rapidly changing component containing phonemic information from a voice signal, the voice signal is first subjected to frequency analysis to obtain a frequency spectral distribution, which is then sampled from one end to the other and then in the reversed order in timed sequence repetitively to produce a periodic waveform. Then, the thus obtained periodic waveform is filtered to remove the relatively slowly changing component thereby extracting the relatively rapidly changing component.

9 Claims, 4 Drawing Sheets

EXTRACTION OF PHONEMIC INFORMATION

This is a continuation of application Ser. No. 713,464, filed Mar. 19, 1985 now abandoned.

BACKGROUND OF THE INVENTION

1. Field of the Invention

This invention generally relates to a method of processing a signal having both a relatively high frequency fluctuation and a relatively low frequency fluctuation, such a voice signal, to extract the relatively high frequency fluctuation and more particularly to a novel method of extracting phonemic information and a linear phase filter particularly suited for use in such a method.

2. Description of the Prior Art

Signal A shown in FIG. 1 is a frequency distribution curve for one frame of voice signal, and, as shown, the curve A has a relatively slowly changing tendency, in which its output level decreases as the frequency increases, and also a relatively quickly changing tendency which is indicated by three local peaks $B_1$, $B_2$ and $B_3$, constituting phonemic information. In one method of recognition of vocal sound, the phonemic information $B_1$, $B_2$ and $B_3$ is extracted from the voice signal A to be used in the recognition of vocal sound. In this case, however, when extracting phonemic information from a voice signal, typically, there arises a problem of a deterioration of high frequency components depending on the sound producing characteristic of the sound source.

In order to carry out the extraction of phonemic information while maintaining high accuracy up to higher frequencies, it has been proposed to carry out correction using an approximate straight line obtained by the least square method. According to this proposed method, the voice spectral distribution $X_i$, where i=channel number, is approximated by a straight line defined by $y=ai+b$, whereby $X_i-(ai+b)$ is defined as a new characteristic parameter of the new voice spectral distribution. In this case, a and b are determined by $$a = \frac{N\left(\sum_{i=1}^{N} iX_i\right) - \sum_{i=1}^{N} X_i \sum_{i=1}^{N} i}{N \sum_{i=1}^{N} i^2 - \left(\sum_{i=1}^{N} i\right)^2}$$

$$b = \frac{\sum_{i=1}^{N} X_i \sum_{i=1}^{N} i^2 - \sum_{i=1}^{N} iX_i \sum_{i=1}^{N} i}{N \sum_{i=1}^{N} i^2 - \left(\sum_{i=1}^{N} i\right)^2}$$

However, the calculation for and b is rather complicated, time-consuming and expensive.

SUMMARY OF THE INVENTION

It is therefore the primary object of the present invention to obviate the disadvantages of the prior art as described above and to provide an improved method and system of processing a signal, such as a voice signal.

Another object of the present invention is to provide a method and system for processing a signal having a relatively slowly changing component and a relatively rapidly changing component to extract the relatively rapidly changing component without distortion.

A further object of the present invention is to provide a method and system of processing a voice signal to extract phonemic information therefrom at high accuracy and efficiency.

A still further object of the present invention is to provide a voice spectrum extraction method and system comparable in performance to the prior art method using a straight line obtained by the least square method for normalizing the voice producing characteristic.

A still further object of the present invention is to provide a linear phase filter which is particularly suited for use in the method of processing a signal having a relatively slowly changing component and a relatively rapidly changing component to have the relatively rapidly changing component extracted.

Other objects, advantages and novel features of the present invention will become apparent from the following detailed description of the invention when considered in conjunction with the accompanying drawings.

DESCRIPTION OF THE PREFERRED EMBODIMENTS

Figure 1:
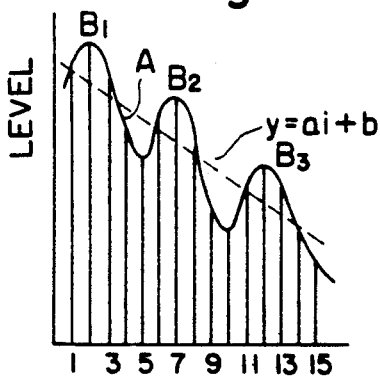
FIG. 1 is a graph showing the typical frequency spectral distribution of voice signal in which fifteen channels are indicated on the abscissa and the ordinate indicates the level of each frequency spectrum.

Although the following description will be made with respect to the case where the present invention is applied to the processing of a voice signal as the preferred embodiment, the present invention should not be limited only to such application. As shown in FIG. 1, when the frequency-analyzed output of a filter bank or the like (15 channels in the illustrated example) is plotted as a function of frequency, there is obtained the signal A having a relatively slowly changing component as indicated by a gradual decrease in level from channel 1 to channel 15 and a relatively rapidly changing component as indicated by three peaks $B_1$, $B_2$ and $B_3$. The frequency distribution pattern A obtained by processing a certain voice signal is characterized by the relatively rapidly changing component, or peaks and valleys, which constitute phonemic information defining a format or the like. Thus, as far as voice recognition is concerned, it is desired to extract the relatively rapidly changing component from the frequency distribution pattern A.

Figure 2:
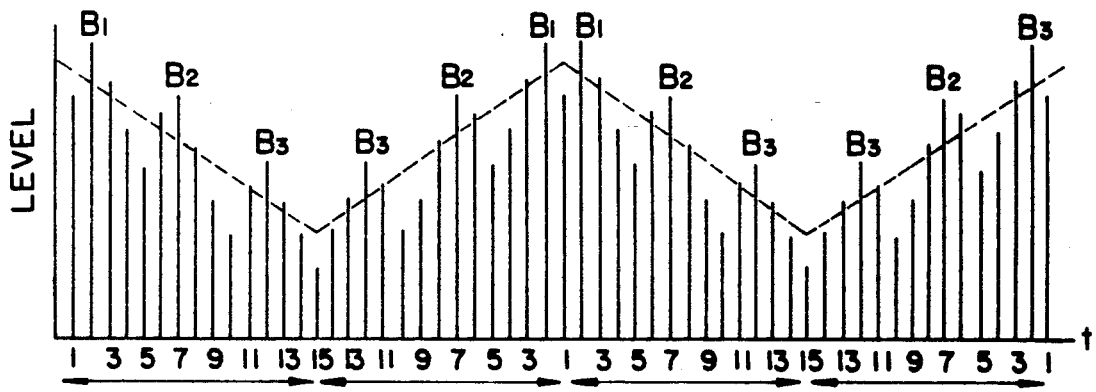
FIGS. 2 and 3 are schematic illustrations which are useful for explaining the principle of the present invention.
Figure 3:
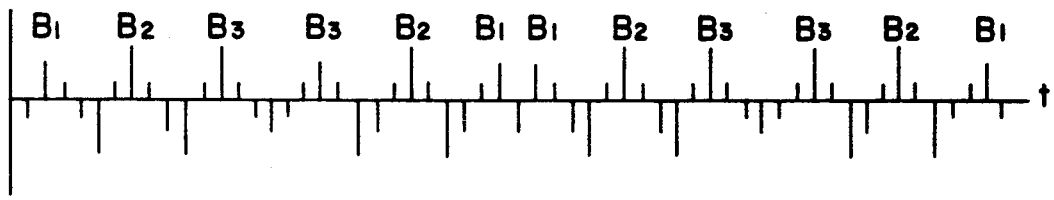

Then, in accordance with the present invention, the distribution pattern shown in FIG. 1 is repeated back and forth, first from channel 1 to channel 15, then from channel 15 to channel 1 and again from channel 1 to channel 15, thereby forming a periodic waveform which changes with time as shown in FIG. 2. Then, the low frequency component defined by the relatively slowly changing component of the signal A as indicated by the dotted line is removed by a high pass filter having a linear phase characteristic, so that there is produced phonemic information $B_1$, $B_2$ and $B_3$ without phase distortion, as shown in FIG. 3. In accordance with the present invention, instead of carrying out correction using a straight line obtained by the least square method, the frequency distribution pattern of one frame obtained as a result of frequency analysis of the voice signal is repeated alternately along a time axis to form a periodic waveform which is then filtered to obtain the phonemic information. Thus, according to the present invention, the desired result may be obtained without using an approximate straight line by the least square method.

Figure 4:
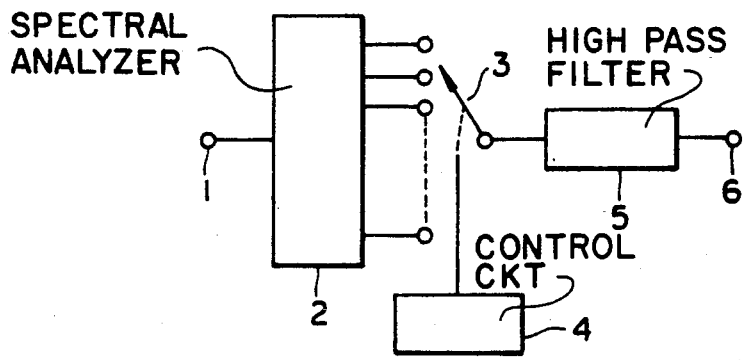
FIG. 4 is a block diagram showing the phonemic information extracting system constructed in accordance with one embodiment of the present invention.

FIG. 4 shows in block form a system for extracting the phonemic information from a sound signal constructed in accordance with one embodiment of the present invention. As shown, the present phonemic information extracting system includes an input terminal 1 for receiving a sound signal, such as voice, a spectral analyzer 2 having a predetermined number of channels for analyzing the frequency of the sound signal over the frequency range determined by the channels, a selector 3 for selecting the output channels of the frequency analyzer 2, a control circuit 4 for controlling the operation of the selector 3 for scanning the output channels of the frequency analyzer 2, a high pass filter 5 for removing the low frequency component, and an output terminal 6.

With this structure, when a sound signal is input into the frequency analyzer 2, which may, for example, be comprised of a filter bank, through the input terminal 1, there is obtained a frequency spectral distribution as shown in FIG. 1. In the illustrated embodiment, the frequency analyzer 2 has fifteen output channels and the output selector 3 scans the output channels in such a manner of from channel 1 to channel 15 in the first sequence, from channel 15 to channel 1 in the next following second sequence, from channel 1 to channel 15 in the next following third sequence, etc., according to the control circuit 4. Thus, there is obtained a timed sequence signal as shown in FIG. 2. A control circuit 4 having such a control function may be easily constructed, for example, from an up/down counter. The thus obtained signal, which is sequential with time t, as shown in FIG. 2, is then passed through the high pass filter 5 having a linear phase characteristic, whereby the low frequency component indicated by the dotted line in FIG. 2 is removed, so that the extracted high frequency component is obtained at the output terminal.

Figure 5:
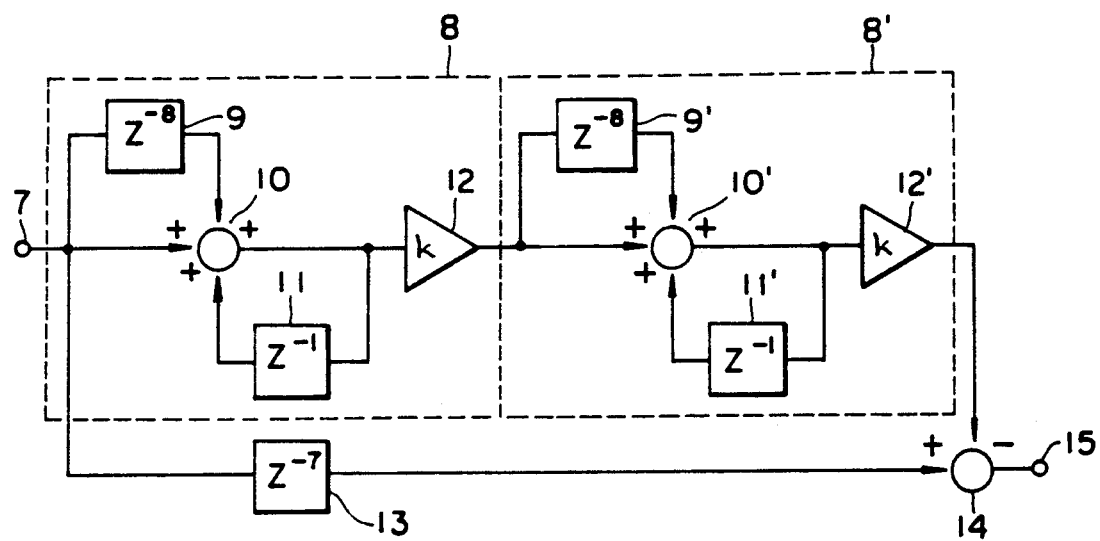
FIG. 5 is a block diagram showing the overall structure of a filter having a linear phase characteristic which is particularly suited for use in the system of FIG. 4.

FIG. 5 shows in block form one example of a high pass filter having a linear phase characteristic, which is particularly suited for use in the system of FIG. 4. As shown, in the illustrated linear phase filter, there is provided a comb filter, which is defined by a loop including a delay element $Z^{-8}$, and an all-pole filter, which is defined by a loop including a delay element $Z^{-1}$ and connected in series with the comb filter. The all-pole filter is a filter which produces only poles and no zeroes. Thus, in the case of an all-pole filter having a delay element $Z^{-p}$, there are produced p number of poles. In the structure shown in FIG. 5, a serial combination 8 of comb and all-pole filters is connected in series with the other serial combination 8' of comb and all-pole filters, thereby defining a low pass filter. A phase corrector 13 is also provided as connected in parallel with the low pass filter having two stages 8 and 8' through a subtractor 14, thereby defining a high pass filter.

In the structure shown in FIG. 5, those elements indicated by $Z^{-p}$, such as 11, 11', 13, 9 and 9', are all delay elements, wherein $Z^{-1}$, $Z^{-7}$ and $Z^{-8}$ indicate that they provide the delay of one fundamental time period, seven fundamental time periods and eight fundamental time periods, respectively. In the first and second stages 8 and 8', the output of each of the delay elements 9 and 9', which provide eight fundamental time periods, is added to the input at the corresponding one of adders 10 and 10'. Since the delay elements 11 and 11' are provided as connected to the respective adders 10 and 10' in a feedback format, the output of the adder 10 or 10' is added back to the adder 10 or 10' with the delay of one fundamental time period. Then, the thus added output is multiplied by a coefficient k by a multiplier 12 or 12'.

Now, if $k=\frac{1}{8}$, the transmission function H(z) of the system is as follows:

$$H(Z) = Z^{-7}\left(1 - \frac{1}{64} \frac{(Z^4 - Z^{-4})^2}{(Z^{\frac{1}{2}} - Z^{-\frac{1}{2}})^2}\right) \quad (1)$$

$$\left[= e^{-7j\omega}\left(1 - \frac{1}{64} \frac{\sin^2 4\omega}{\sin^2 \frac{\omega}{2}}\right) = H(j\omega)\right]$$

Thus, there is defined a high pass filter. Such a circuit may be constructed, for example, by a microprocessor. The above equation (1) may be rewritten as follows:

$$H(Z)=Z^{-7}(1-(1/64)(1+Z^{-1}+Z^{-2}+\ldots +Z^{-7})^2) \quad (2)$$

Figure 6:
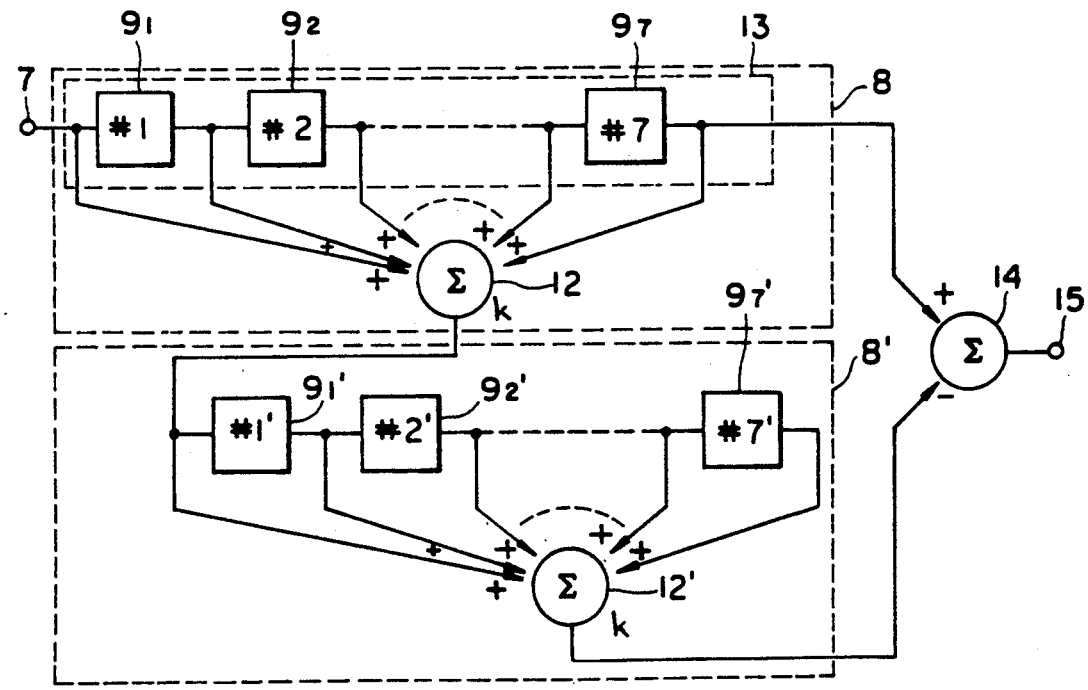
FIG. 6 is a block diagram showing another embodiment of a linear phase filter.

FIG. 6 shows in block form one example of a circuit constructed according to the above equation (2). In FIG. 6, $9_1$ through $9_7$ and $9_1{}'$ through $9_7{}'$ each indicate a delay element providing one fundamental time period delay, and their outputs are added and multiplied by coefficient k (here, $k=\frac{1}{8}$) at adders 12 and 12', respectively. On the other hand, with the delay of $Z^{-7}$, from the output of $9_7$, the output of adder 12' is subtracted at a subtractor 14 to provide an output signal at the output terminal, so that it will be understood that there is realized a high pass filter. It is to be noted that each of these delay elements may be easily constructed by an analog shift register, such as a B.B.D., or a sample and hold circuit.

As described above, in accordance with the present invention, a desired voice frequency spectral distribution can be extracted from a voice signal without phase distortion by a simple structure, and the spectral distribution thus obtained is substantially equivalent in quality to the information obtained through a correction using an approximate straight line by the least square method. It is to be noted, however, that the present invention should not be limited only to the application of processing of a voice signal, and the present invention is equally applicable to the analysis, for example, of light spectrum. Stated in general terms, this aspect of the present invention is characterized in processing a signal having a relatively slowly changing component and a relatively rapidly changing component to have the relatively rapidly changing component extracted without causing phase distortion.

Now, another aspect of the present invention will be described with particular reference to FIGS. 7 through 10. This aspect of the present invention relates to the technology for constructing the digital linear phase finite impulse response filter in the analog format.

In general, in the application where a stress is placed on the waveform information as described above, it is typically desired to provide a simple method for removing the information in the frequency band outside of the region of interest without causing a distortion in the waveform. For this reason, there has been proposed a linear phase filter utilizing digital technology.

Figure 7:
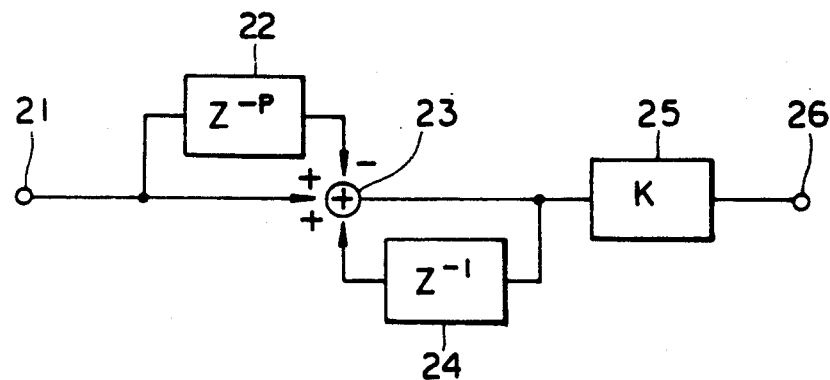
FIGS. 7 and 8 are block diagrams each showing a typical prior art linear phase filter using digital technology.

FIG. 7 shows in block form such a prior art linear phase filter utilizing digital technology, and it includes an input terminal 21, a multiple delay element 22 for providing P units of a fundamental time delay, an adder 23, a unit delay element 24 for providing one unit of a fundamental time delay, a multiplier 25 and an output terminal 26. As described before, the linear phase filter shown in FIG. 7 is comprised of a serial combination of a comb filter and an all-pole filter, so that its transmission function may be expressed as follows:

$$H_L(Z) = k \frac{1 - Z^{-P}}{1 - Z^{-1}} = kZ^{-\frac{P-1}{2}} \frac{Z^{\frac{P}{2}} - Z^{-\frac{P}{2}}}{Z^{\frac{1}{2}} - Z^{-\frac{1}{2}}} \quad (3)$$

$$H_L(\omega) = ke^{-\frac{P-1}{2}\omega} \frac{\sin \frac{P}{2} \omega}{\sin \frac{1}{2} \omega} \quad (4)$$

Accordingly, the structure shown in FIG. 7 effectively defines a low pass filter.

Figure 8:
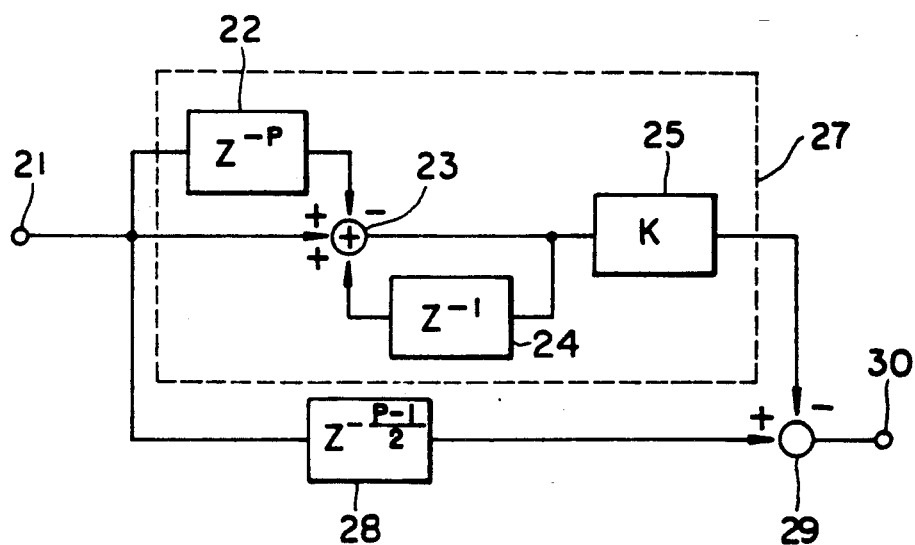

FIG. 8 shows a high pass filter which is constructed by adding a delay element 28 for providing the time delay of (P-1)/2 to the structure shown in FIG. 7 as connected between the input and output terminals of the structure shown in FIG. 7 through an adder 29. Thus, with the structure of FIG. 8, after phase adjustment by the delay element 28, the delayed input signal is supplied to the adder 29 where the low frequency component from the low pass filter 27 is subtracted from the delayed input signal thereby providing the high frequency component to an output terminal 30. Thus, the transmission function in this case may be expressed as follows:

$$H_H(Z) = Z^{-\frac{P-1}{2}} \left( 1 - k \frac{Z^{\frac{P}{2}} - Z^{-\frac{P}{2}}}{Z^{\frac{1}{2}} - Z^{-\frac{1}{2}}} \right) \quad (5)$$

$$H_H(\omega) = e^{-\frac{P-1}{2}\omega} \left( 1 - k \frac{\sin \frac{P}{2} \omega}{\sin \frac{1}{2} \omega} \right) \quad (6)$$

As described before, $Z^{-1}$ and $Z^{-P}$ indicate the time delay over one fundamental time period and P units of one fundamental time period, respectively, and k is a multiplier, which is typically equal to 1/P. As is obvious, such a digital filter cannot be used as it is in the case where the signal is processed in the analog format as in the above-described application With the foregoing premise, this aspect of the present invention is directed to providing a digital linear phase filter in the analog format, capable of effectively processing an analog signal.

Now, the above equation (3) may be modified to obtain the following equation.

$$H_L(Z) = k(1 + Z^{-1} + Z^{-2} + \ldots + Z^{-(P-1)}) \quad (3')$$

This function may be implemented by connecting (P-1) number of unit fundamental delay elements, which provide one fundamental time delay, in series and by adding the outputs from these delay elements after multiplication by a coefficient k.

Figure 9:
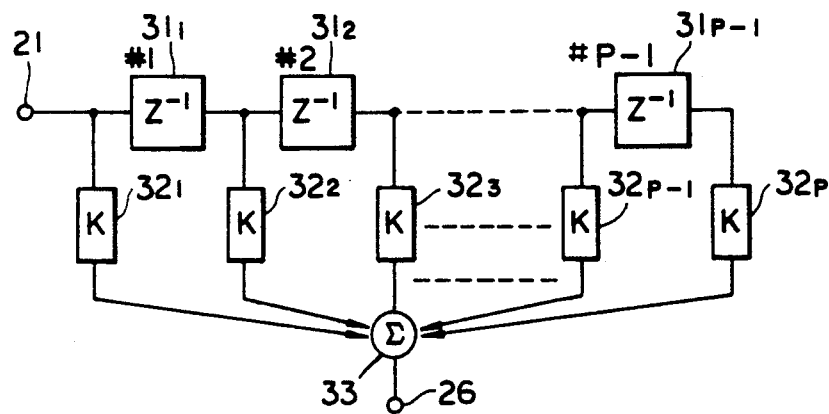
FIGS. 9 and 10 are block diagrams showing examples of analog linear phase filters embodying the present invention.
Figure 10:
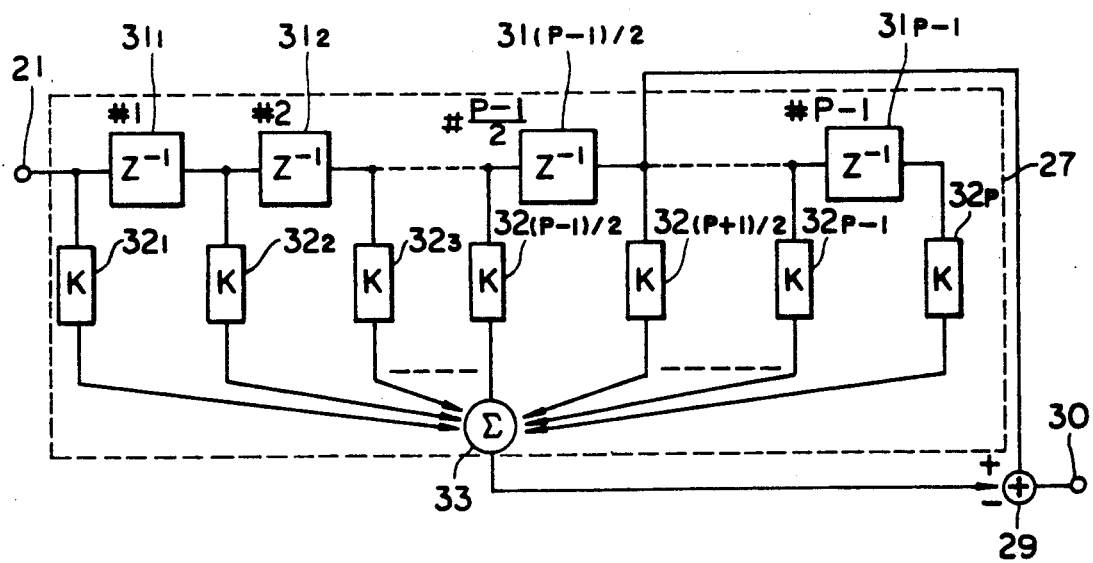

FIG. 9 illustrates in block form one example of the low pass filter constructed in accordance with the above equation (3'). As shown, the filter includes the input terminal and (P-1) number of unit delay elements $31_1$ through $31_{P-1}$, which may be easily formed from sample hold circuits or charge transfer devices, such as B.B.Ds., which are analog shift registers, in the case where a shift register analog signal is to be handled. Also provided are multipliers $31_1$ through $32_p$ which multiplies the signal by the factor of k, which is typically equal to 1/P. Also provided in the structure of FIG. 10 are an adder 33 for adding the outputs from the multipliers $31_1$ through $32_{p-1}$ and the output terminal 30. It will be easily appreciated that the structure shown in FIG. 10 may be cascade-connected.

Next, the above equation (5) may be modified to obtain the following equation.

$$H_H(Z) = Z^{-(P-1)/2}(1 - k(1 + Z^{-1} + Z^{-2} + \ldots + Z^{-(P-1)})) \quad (5')$$

FIG. 10 illustrates one example of a high pass filter constructed in accordance with the above equation (5'). In this case, as indicated in FIG. 8, it is only necessary to provide the phase adjusting element 28 as connected in parallel with the low pass filter 27, to thereby execute to subtraction, and the low pass filter 27 may be constructed using the structure shown in FIG. 9. In the structure shown in FIG. 8, the phase adjusting component 28 is provided as a discrete element. However, if use is made of the output from the delay element $31_{(P-1)/2}$ of the low pass filter 27 shown in FIG. 9, there is obtained a signal of $Z^{-(P-1)/2}$. Thus, such a discrete phase adjusting element 28 may be discarded if use is made of the output from the delay element $31_{(P-1)/2}$ of the low pass filter 27, as shown in FIG. 10. In the structure shown in FIG. 10, the algebraic sum between the output from the delay element $31_{(P-1)/2}$ and the output from adder 33 of the low pass filter 27 is obtained at the adder 29, thereby providing a high pass filtered output signal to the output terminal 30. It will be easily understood that the low pass filter portion in the structure of FIG. 10 or the structure of FIG. 10 itself may be connected in the form of a cascade.

It should further be noted that the above description is the case in which a linear phase filter is formed by utilizing discrete signals in the analog format, but such a structure may also be constructed by software-implemented in a digital format. This aspect of the present invention realizes a linear phase filter which produces no phase distortion by a simple structure and which is particularly advantageous when applied to the case where a stree is placed on the waveform information.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A method for processing a signal obtained by subjecting a voice signal to frequency analysis and represented as a variation of level relative to frequency, the voice signal extending over a predetermined frequency range and having a component which changes relatively slowly with respect to frequency and a component which changes relatively rapidly with respect to frequency in order to extract said relatively rapidly changing component, the improvements comprising the steps of:

sampling said voice signal repetitively at predetermined frequency intervals first from one end to the other end of said range and then in reverse to thereby form a periodic sampled signal as a function of time, wherein the period of said periodic sampled signal corresponds to twice said range; and removing said relatively slowly changing component from said sampled signal by filtering to extract the information of said relatively rapidly changing component.

2. The method of claim 1, wherein said relatively rapidly changing component defines phonemic information of said voice signal.

3. A signal processing system for extracting phoneme information from a voice signal, comprising:

input means for inputting a voice signal;

voice analyzing means including a plurality of filters for extracting components different in frequency bands from the input voice signal for supplying a signal obtained by sampling an output from each of said filters from an output channel corresponding to said filter;

signal generating means, including a switching means for selectively switching to any one of outputs of said output channels and a controlling means for applying said switching means to all of said output channels at a predetermined time period back and forth, for rearranging the outputs of said output channels in timed sequence in synchronism with the time period of said back and forth application to thereby generate a timed signal;

separating means for separating the phoneme information which constitutes a high frequency component of said timed signal from the vocal information which constitutes a low frequency component of said timed signal; and outputting means for outputting only the phoneme information thus separated by said separating means.

4. The system of claim 3, wherein said controlling means controls the operation of said switching means such that the output channels of said filters are switched in an order of 1, 2, . . . , n−1, n, n−1, . . . , 2, 1 in repetition by means of an up/down counter.

5. The system of claim 3, wherein said separating means includes a high pass filter.

6. The system of claim 5, wherein said high pass filter includes a linear phase characteristic.

7. The system of claim 6, wherein said high pass filter is defined as follows, using H(z) as a system function, $$H(Z) = Z^{-7}\left\{ 1 - \frac{1}{64} \frac{(Z^4 - Z^{-4})^2}{(Z^{1/2} - Z^{-1/2})^2} \right\} \quad (1)$$

$$\left[ = O^{-7jw}\left\{ 1 - \frac{1}{64} \frac{\sin^2 4w}{\sin^2(w/2)} \right\} = H(jw) \right].$$

8. The system of claim 6, wherein said high pass filter is defined as follows, using H(z) as a system function, $$H(Z) = Z^{-7}\left\{ 1 - \frac{1}{64}(1 + Z^{-1} + Z^{-2} + \ldots + Z^{-7})^2 \right\}. \quad (2)$$

9. A signal processing system comprising:

input means for receiving a sound signal;

means for producing from said sound signal a second signal representing a variation of level relative to frequency, which second signal extends over a predetermined frequency range and has phonemic information which changes relatively rapidly with respect to frequency and a component which changes relatively slowly with respect to frequency;

means for sampling said second signal at predetermined frequency intervals first from one end to the other end of said range and then in reverse to thereby form a periodic sampled signal as a function of time whose period corresponds to twice said range; and filtering means for removing said relatively slowly changing component from said sampled signal to extract the phonemic information and to supply said phonemic information to an output terminal.

* * * * *